United States Patent

Houdeau et al.

[11] Patent Number: 5,883,429
[45] Date of Patent: Mar. 16, 1999

[54] CHIP COVER

[75] Inventors: Detlef Houdeau, Regensburg; Josef Kirschbauer, Blaibach; Christl Niederle, München; Peter Stampka, Schwandorf; Hans-Hinnerk Steckhan, München, all of Germany

[73] Assignee: Siemens Aktiengesellschaft, Munich, Germany

[21] Appl. No.: 958,261

[22] Filed: Oct. 27, 1997

Related U.S. Application Data

[63] Continuation of PCT/DE96/00616, Apr. 9, 1996.

[30] Foreign Application Priority Data

Apr. 25, 1995 [DE] Germany ............ 195 15 188.7
Apr. 9, 1996 [WO] WIPO .......... PCT/DE96/00616

[51] Int. Cl.⁶ ................................................ H01L 23/12
[52] U.S. Cl. ................................. 257/704; 257/679
[58] Field of Search ........................... 257/704, 682, 257/679

[56] References Cited

U.S. PATENT DOCUMENTS

| | | |
|---|---|---|
| 3,725,671 | 4/1973 | Keister et al. . |
| 4,630,095 | 12/1986 | Otsuka et al. ................ 257/682 |
| 5,233,563 | 8/1993 | Yakura et al. . |
| 5,392,305 | 2/1995 | Jakobson .................... 257/679 |
| 5,399,441 | 3/1995 | Bearinger et al. . |
| 5,406,630 | 4/1995 | Piosenka et al. . |
| 5,491,361 | 2/1996 | Stupian ...................... 257/682 |

FOREIGN PATENT DOCUMENTS

| | | |
|---|---|---|
| 0510433A3 | 10/1992 | European Pat. Off. . |
| 3602960C1 | 2/1987 | Germany . |
| 4138665A1 | 6/1992 | Germany . |
| 91/05306 | 4/1991 | WIPO . |

OTHER PUBLICATIONS

"Chipkarten–ICs–massgeschneiderte Sicherheit für jede Anwendung"(Ulrich Hamann et al.), Components 32, 1994, vol. 4, pp. 106–110.

"Method for Manufacturing a Low–Cost Power Regulator Card", IBM Technical Bulletin, vol. 32, no. 7, Dec. 1989.

*Primary Examiner*—Mahshid D. Saadat
*Assistant Examiner*—S. V. Clark
*Attorney, Agent, or Firm*—Herbert L. Lerner; Laurence A. Greenberg

[57] ABSTRACT

A chip cover for complete or partial covering of electrical, electronic, optoelectronic and/or electromechanical components includes an activator capable of fully or partially destroying the electrical, electronic, optoelectronic and/or electromechanical components of the chip when activated. The activator can be activated by an attempt to remove the chip cover from the chip. In this way it is possible to reliably prevent reverse engineering and/or manipulation of the chip.

16 Claims, 1 Drawing Sheet

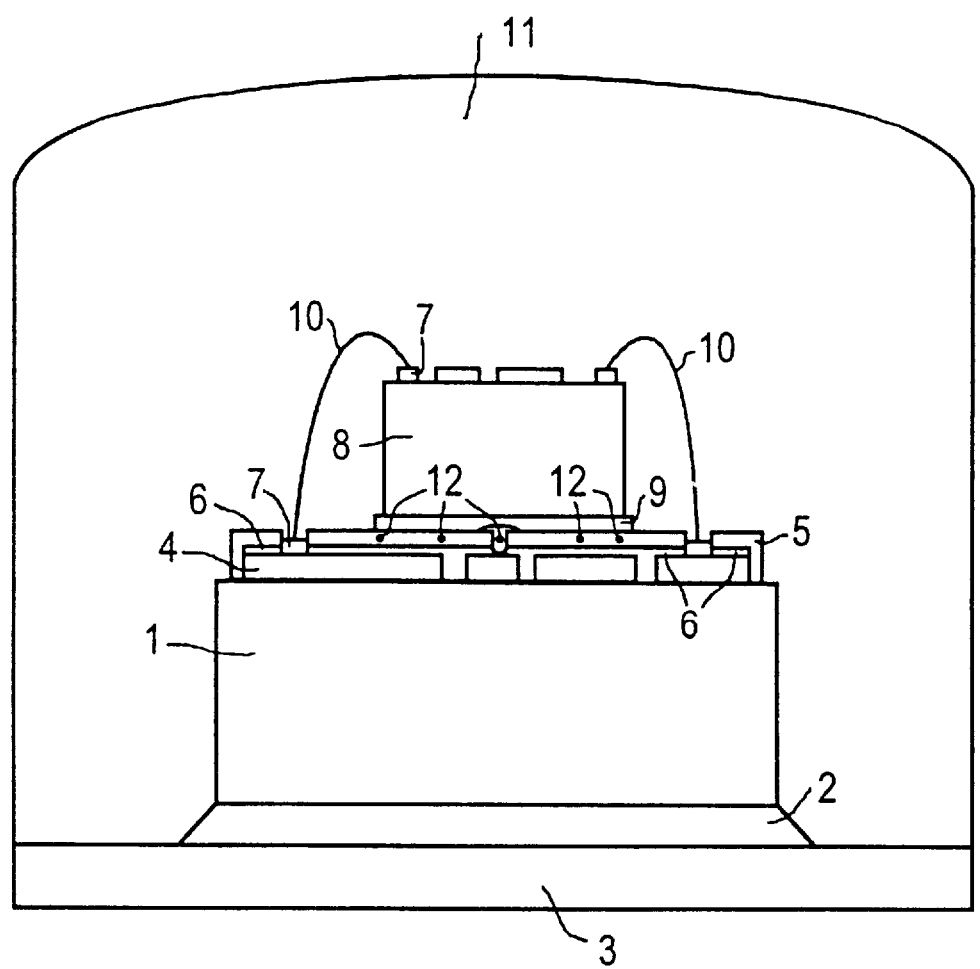

CHIP COVER

CROSS-REFERENCE TO RELATED APPLICATION

This application is a Continuation of International Application Serial No. PCT/DE96/00616, filed Apr. 9, 1996.

BACKGROUND OF THE INVENTION

Field of the Invention

The present invention relates to a chip cover for complete or partial covering of electrical, electronic, optoelectronic and/or electromechanical components of a chip.

Such chip covers protect covered regions of the chip from damage due to mechanical force and environmental conditions.

In the case of chips provided on chip cards, smart cards and the like, the chip covers have heretofore been removable, for example by chemical methods (for example by using fuming $HNO_3$), so that an accurate analysis of the chip circuit and/or manipulations of the chip circuit can be carried out with relative ease.

The possible carrying out of such analyses and/or manipulations of the chip circuit is undesired, since it leads to the possibility of misuse.

As an example thereof, mention may be made of the chip cards or smart cards which are used in the pay television sector. If a hacker succeeds in analyzing the chip circuit which enables access to a particular television channel, with regard to the position and the function of individual components and/or the routing of the interconnections within the chip and gains the capacity to manipulate them by suitable jumpers or the like, then the hacker can thereby become able to use a fee-paying service for free.

Such possibilities of manipulation are important not only in the pay television sector but also in the case of all types of chips used for access control, and open up innumerable possibilities for misuse, which can lead not only to financial losses but also to a considerable security risk.

SUMMARY OF THE INVENTION

It is accordingly an object of the invention to provide a chip cover, which overcomes the hereinafore-mentioned disadvantages of the heretofore-known devices of this general type in such a way that reverse engineering and/or manipulations of chips can be reliably prevented.

With the foregoing and other objects in view there is provided, in accordance with the invention, a chip cover assembly, comprising a chip cover for complete or partial covering of electrical, electronic, optoelectronic and/or electromechanical components of a chip; and an activator to be activated for releasing a substance for fully or partially destroying at least one of the components of the chip, the activator to be activated by an attempt to remove the chip cover from the chip.

It is thereby possible to bring about destruction of the security-related regions of the chip simultaneously with removal of the chip cover.

Reverse engineering and manipulations of the chip can thereby be reliably prevented.

In accordance with another feature of the invention, the chip is an uncased chip disposed on a chip card or a smart card and covered by the cover, or the chip is a controller module or an ASIC module.

In accordance with a further feature of the invention, the activator is disposed in a recess formed in the chip cover or the activator is integrated into a material matrix of the chip cover.

In accordance with an added feature of the invention, the activator releases a substance having reducing action when the activator is activated and the components of the chip are destroyed by the substance having reducing action.

In accordance with an additional feature of the invention, the components of the chip are aluminum structures.

In accordance with yet another feature of the invention, the activator is $RCl_2$ and a free radical is formed when the $RCl_2$ is activated.

In accordance with yet a further feature of the invention, the free radical is the substance having reducing action.

In accordance with yet an added feature of the invention, the activator is activated by a solvent dissolving the chip cover.

In accordance with yet an additional feature of the invention, the activator is activated by an activating agent stored inside the chip cover.

In accordance with again another feature of the invention, the chip has a security-related region, and another chip is disposed over the security-related region.

In accordance with again a further feature of the invention, the activator is disposed in the chip cover over the security-related region of the chip.

In accordance with a concomitant feature of the invention, the chip cover has a plurality of layers.

Other features which are considered as characteristic for the invention are set forth in the appended claims.

Although the invention is illustrated and described herein as embodied in a chip cover, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The figure of the drawing is a diagrammatic, sectional view of two chips which are fitted one on top of the other and which have security-related regions that are covered by a chip cover according to an illustrative embodiment of the invention.

DESCRIPTION OF THE PREFERRED EMBODIMENTS

Referring now in detail to the single figure of the drawing, in which shading has been omitted for the sake of clarity, it is seen that reference number 1 denotes a first uncased chip in the form of a controller. As an example, the Siemens module or chip SLE 44C20 with ROM, PROM, EEPROM and RAM can be used as the controller. The first chip 1 is fastened on a system support 3 through the use of an adhesive 2.

The system support 3 may, for example, be a plastic card for producing a chip card or smart card, but it may also be a flexible printed-circuit board or a so-called lead frame.

Aluminum interconnections 4 run over that surface of the first chip 1 which is the upper surface, according to the figure.

The interconnections 4 are covered by a first chip-cover layer in the form of a structured Si nitride ($Si_3N_4$) layer 5. The purpose of this layer 5 is to protect the chip from damage due to environmental conditions, in particular from damage due to humidity and moisture.

A second chip-cover layer in the form of a polyimide layer 6 is provided over the $Si_3N_4$ layer 5. The polyimide layer 6 protects the underlying chip structures from mechanical damage.

Recesses at which aluminum contact points 7 (Al pads) are exposed are provided in the chip-cover layers 5 and 6.

A second uncased chip 8 in the form of an ASIC module or chip (application-specific integrated circuit) is provided over the first chip 1.

The second chip 8 is bonded through the use of an adhesive 9 on the polyimide layer 6 which was already mentioned above.

The second chip 8 likewise has aluminum contact points 7 on its side which is the upper side according to the figure.

The contact points 7 of the first chip and the contact points 7 of the second chip are connected together by bonding wires 10.

The entire configuration described above is surrounded by a third chip-cover layer in the form of a so-called globe top 11, the purpose of which is to protect the configuration from environmental conditions and mechanical damage. In the present case, the globe top 11 is formed of epoxy resin.

The configuration which is described above and shown in the figure is part of a chip card, smart card or the like.

The first, second and third chip-cover layers 5, 6 and 11 and the adhesives 2, 9 are generally formed of materials which are chemically removable. Fuming $HNO_3$ is, for example, suitable for the chemical removal because, although it destroys the chip cover, it does not destroy the interconnections 4 and the contact points 7 which are formed of aluminum.

In order to prevent such a chemical removal from providing the possibility of reverse engineering and/or manipulation of security-related regions of the chips, activators in the chip cover are provided over these regions.

In the case of chip cards, smart cards and the like, with chips disposed one on top of the other, the safety-related region which is to be protected from reverse engineering and manipulation is generally the underlying controller chip 1. This region shall also be the safety-related region in the present illustrative embodiment.

In the present illustrative embodiment, the activator is a material which is activated upon encountering a material in the form of a solvent, an etchant or the like, which chemically dissolves the chip cover, that is to say, for example, it is activated upon encountering fuming $HNO_3$. Upon activation, a substance having reducing action is released. That substance destroys those chip structures which are formed of aluminum, such as, for example, the interconnections 4, and thereby renders reverse engineering and/or manipulation of the security-related regions impossible. The activator does not attack the chip in the unactivated state.

In the present illustrative embodiment, the destruction of the chip structures after activation of the activator takes place by dissolving these structures through the use of chemical reduction.

In the present illustrative embodiment, the activator is formed of $RCl_2$. Upon encountering $HNO_3$, free radicals are formed according to the reaction equation

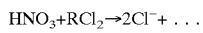

and, as a result of their reducing nature, these free radicals destroy the aluminum structures lying under the chip cover.

The use of activators which release oxidizing substances upon encountering $HNO_3$ does not lead to the desired result in this case, since oxidizing substances have an effect on the aluminum structures only until these structures are coated with an oxide layer, which thereupon gives the aluminum structure a self-protection function and does not lead to destruction of the aluminum structures at all.

The activators, which are indicated by reference numeral 12 in the figure, may be provided over the security-sensitive region in window-like gaps or recesses, that are exposed to this end in the $Si_3N_4$ layer 5 and/or in the polyimide layer 6. When the chip card, smart card and the like has been manufactured, the activator is enclosed in these gaps or recesses by the chip cover.

As an alternative to this structure, the activator may also be incorporated into the polyimide matrix.

It is not required for the activator, in the unactivated state, to come into contact with the aluminum structures which are to be destroyed when appropriate. The positioning of the activator may be tailored to suit the varying requirements or the respective chips.

The type of activator is preferably tailored to match the chemical substances which may be employed for dissolving the chip cover, so that, when any solvent encounters the activator, the desired activation of the activator is reliably initiated.

However, the effect of the activation may be chosen in any desired way, so long as analysis and/or manipulation of the chip can thereby be prevented. Instead of the above-explained destruction of the aluminum structure by chemical reduction thereof, provision might thus also be made, for example, to destroy the chip by producing heat energy or the like.

Provision may also be made to provide a plurality of different activators which each react with different solvents, in accordance with requirements, so that even the most varied types of solvents each activate at least one activator.

Another substance which is capable of activating the activator according to requirements may also be provided in the chip cover in addition to the activator. The other substance may be provided separately from but in the same way as the activator. The activator substance can thus be selected independently of the solvents in question, since when the chip cover is removed both the activator and the substance which activates the latter according to requirements, are released.

The last-mentioned possibility affords the advantage of permitting destruction of the security-related chip structures to take place even when an attempt is made to render these structures accessible by using a nonchemical provision.

The provision of the above-described activator in the chip cover makes it possible for the security-related regions of the chip to be destroyed automatically if an attempt is made to render these accessible by removing the chip cover.

Considering the fact that the structures to be destroyed in this case have extremely small dimensions, the amount of activator to be provided, with corresponding positioning, is likewise extremely small.

A further measure for enhancing security against reverse engineering and/or manipulations of chips resides in placing the less security-related chip, that is to say the ASIC chip 2 in the present illustrative embodiment, exactly over the security-related region of the other chip, that is to say exactly over the most security-related region of the controller chip in the present illustrative embodiment. The possibility that the chip may be analyzed and/or manipulated without the cover being removed is thereby also ruled out, for lack of optical accessibility.

The above-described illustrative embodiment relates to a so-called chip on chip on flex structure with a chip and wire connection technology. It is self-evident that the invention is not restricted to such a structure, but can also be employed in the case of single chips and in the case of any desired number of arbitrarily disposed chips which are connected together in any desired way.

There is furthermore no restriction to the materials used according to the above description. They can be replaced by any other desired materials so long as the materials fulfill the function intended for them.

By virtue of the chip-cover structure according to the invention which has been described above, reverse engineering and manipulations of the chip can be reliably prevented with ease, largely independently of the construction of the configuration.

We claim:

1. A chip cover assembly, comprising:
   a chip cover for at least partial covering at least one of electrical, electronic, optoelectronic and electromechanical components of a chip; and
   an activator to be activated for releasing a substance for at least partially destroying at least one of the components of the chip, said activator to be activated by an attempt to remove said chip cover from the chip.

2. The chip cover assembly according to claim 1, wherein the chip is an uncased chip disposed on a chip card or a smart card and covered by said cover.

3. The chip cover assembly according to claim 1, wherein the chip is a controller module or an ASIC module.

4. The chip cover assembly according to claim 1, wherein said activator is disposed in a recess formed in said chip cover.

5. The chip cover assembly according to claim 1, wherein said activator is integrated into a material matrix of said chip cover.

6. The chip cover assembly according to claim 1, wherein said activator releases a substance having reducing action when said activator is activated.

7. The chip cover assembly according to claim 6, wherein the components of the chip are destroyed by the substance having reducing action.

8. The chip cover assembly according to claim 1, wherein the components of the chip are aluminum structures.

9. The chip cover assembly according to claim 1, wherein said activator is $RCl_2$.

10. The chip cover assembly according to claim 9, wherein a free radical is formed when the $RCl_2$ is activated.

11. The chip cover assembly according to claim 6, wherein said activator is $RCl_2$, a free radical is formed when the $RCl_2$ is activated, and the free radical is the substance having reducing action.

12. The chip cover assembly according to claim 1, wherein said activator is activated by a solvent dissolving said chip cover.

13. The chip cover assembly according to claim 1, wherein said activator is activated by an activating agent stored inside said chip cover.

14. The chip cover assembly according to claim 1, wherein the chip has a security-related region, and another chip is disposed over the security-related region.

15. The chip cover assembly according to claim 14, wherein said activator is disposed in said chip cover over the security-related region of the chip.

16. The chip cover assembly according to claim 1, wherein said chip cover has a plurality of layers.

* * * * *